United States Patent [19]

Musmann et al.

[11] Patent Number: 4,467,316

[45] Date of Patent: Aug. 21, 1984

[54] GENERALIZED INTERPOLATIVE METHOD FOR DIGITAL/ANALOG CONVERSION OF PCM SIGNALS

[75] Inventors: Hans-Georg Musmann, Salzgitter-Bad; Wilhelm W. Korte, Wedemark, both of Fed. Rep. of Germany

[73] Assignee: Licentia Patent-Verwaltungs-GmbH, Frankfurt am Main, Fed. Rep. of Germany

[21] Appl. No.: 269,942

[22] Filed: Jun. 3, 1981

[30] Foreign Application Priority Data

Jun. 3, 1980 [DE] Fed. Rep. of Germany ....... 3021012

[51] Int. Cl.³ .......................................... H03K 13/02
[52] U.S. Cl. ...................... 340/347 DA; 340/347 CC; 340/347 M; 375/94
[58] Field of Search ........................... 375/27, 26, 94; 364/724; 340/347 DA

[56] References Cited

U.S. PATENT DOCUMENTS 3,843,940 10/1974 Ishiguro et al. ................. 375/27 X

FOREIGN PATENT DOCUMENTS 1444216 7/1976 United Kingdom .

OTHER PUBLICATIONS

Ritchie et al., Interpolative Digital to Analog Converter, IEEE No. 11, 11/1974.

Primary Examiner—T. J. Sloyan
Attorney, Agent, or Firm—Spencer & Frank

[57] ABSTRACT

A method for effecting digital to analog conversion of PCM signals by a generalized interpolative procedure, by sampling the PCM signals at a first sampling rate and supplying each sampled word in succession to a first input of a digital adder; dividing each word at the output of the adder into a first part representing the higher value portion of the adder output word and having a length shorter than that of the adder input word, and a second part representing the lower value part of the adder output word; conducting the second part of each adder output word through a digital, nonrecursive counter feedback filter having a degree greater than one at a clock pulse rate which is an integral multiple of the sampling rate, and supplying each resulting word at the filter output to a second input of the digital adder where it is added to the stored word at the first adder input; converting the first part of each adder output word into an analog signal in a digital/analog converter having a small number of available output values; and passing the analog signal at the output of the converter through an analog lowpass filter.

4 Claims, 10 Drawing Figures

Power Density Spectrum of the Quantizing Error $S_q$ : Without error feedback
$S_q'$ : With first degree filter for error feedback
$S_q''$ : With higher degree filter for error feedback

FIG.4

| Filter Degree R | approx. optimum filter coefficients $g_r$; $r=1,\ldots,R$ | | | | $\sum_{r=1}^{R}|g_r|$ | approx. gain, $P_q/P_q^*$ for $N\gg 1$ |
|---|---|---|---|---|---|---|
| 1 | 1 | | | | 1 | $\dfrac{3}{\pi^2}N^3$ |
| 2 | 2; −1 | | | | 3 | $\dfrac{5}{\pi^4}N^5$ |
| 3 | 3; −3; 1 | | | | 7 | $\dfrac{7}{\pi^6}N^7$ |
| 4 | 4; −6; 4; −1 | | | | 15 | $\dfrac{9}{\pi^8}N^9$ |
| R | Binomial coefficients with alternating sign | | | | $2^R - 1$ | $\dfrac{2R+1}{\pi^{2R}} N^{2R+1}$ |

GENERALIZED INTERPOLATIVE METHOD FOR DIGITAL/ANALOG CONVERSION OF PCM SIGNALS

BACKGROUND OF THE INVENTION

The present invention relates to a method for effecting digital/analog conversion of PCM signals by a generalized interpolation.

Presently available digital/analog converters with high amplitude resolution of up to n=18 bits per sample operate according to the principle of weighted current sources, as described in the publication by Seitzer, D: "Elektronische Analog-Digital-Umsetzer" [Electronic Analog/Digital Converters] published by Springer Verlag in the Federal Republic of Germany, in 1977. The simple digital portion of the converter essentially includes registers for storing the respectively applicable code word at the input of the converter. The more complicated analog portion of a digital/analog converter with an amplitude resolution corresponding to n bits per sample is composed of n connected precision current sources whose weighted currents are combined at the output of the converter. The weighting of the currents is effected to correspond to the value of the bits switching the input.

The manufacture of a digital/analog converter with weighted current sources, for an amplitude resolution corresponding to n bits per sample, requires the use of components having a tolerance of 1 part in $2^n$. For example, for a 16-bit digital/analog converter this tolerance is 1 part in 65,536. When constructing such converters, the requirements for precision of this order of magnitude can be met only with the use of expensive precision components and by the implementation of a cost-intensive matching procedure. A uniformly high amplitude resolution, e.g. of 16 bits per sample, after long periods of operation can be assured only by repeatedly renewed matching.

Upon a change in the PCM code words applied to the input, not all weighted current sources will switch at exactly the same moment so that for a short time undefined, peak-like currents flow at the output of the digital/analog converter. These switching peaks, also called spikes or glitches, must be suppressed by complicated follower circuits since otherwise, for example if the converters are used in high quality PCM audio systems, they would lead to noticeable reductions in fidelity.

An interpolative method for digital/analog conversion of PCM signals has been proposed by Ritchie, G. R., Candy, J. C. and Ninke, W. H., in the article "Interpolative Digital to Analog Converters", published in IEEE Transactions on Communications, November 1974. Here each PCM code word of a length of n bits present at the input is split into two parts. The higher valued, or weighted, code word part, of a length of k bits, is switched to an adder whose outputs are connected with a digital/analog converter constructed to produce $2^k+1$ analog representative values. The remaining code word part, of a length of m bits and a lower value, or weight, is switched to an accumulator composed of a register and a binary adder and which operates at a clock pulse frequency $f_S$ which is greater by the factor $N=2^m$ than the PCM sampling frequency $f_A$. The accumulator repeatedly effects binary addition of the m-bit word part to the m least significant bits of the result of the preceding addition. The carries, i.e. the bits in the (m+1)th bit position, are added to the higher valued code word part of the length of k bits and are thus considered in the subsequently connected digital/analog converter.

Figure 1A:
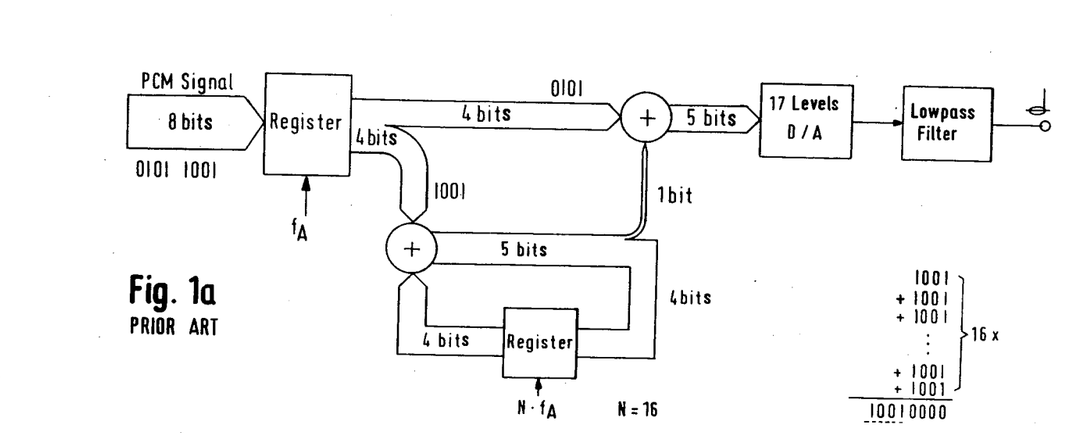
FIGS. 1a and 1b are a block circuit diagram and waveform diagram, respectively, illustrating a prior art digital/analog converter, and have already been described.
Figure 1B:
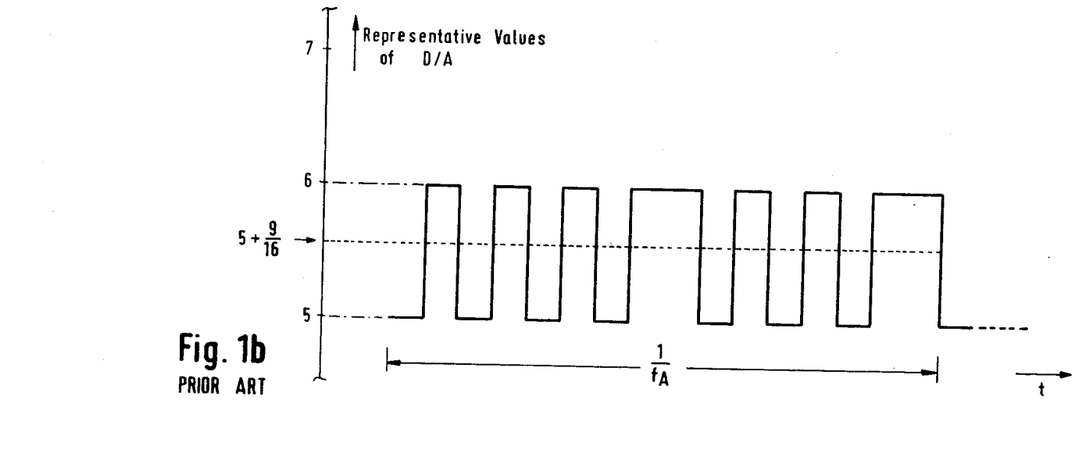

The operating principle of such a system is shown in FIGS. 1a and 1b, which illustrate the principle of an interpolative digital/analog converter according to Ritchie et al, supra. FIG. 1a shows the basic circuit arrangement while FIG. 1b shows the waveform of the D/A converter output over one sampling period, $1/f_A$. For the illustrated example, n=8 and k=m=4. The higher valued 4-bit code word part is initially used to preselect a representative amplitude value for the output of the digital/analog converter. Controlled by the transmitted signal from the accumulator, which includes the register clocked at a frequency $Nf_A$ and a binary adder connected in series therewith, switching is effected between the preselected representative value and the next higher representative amplitude value in a pattern determined by the value of the k-bit part so that over the sampling interval $1/f_A$ the information of the lower valued 4-bit code word part determines the average value of the analog output signal. The time averaging is effected by a lowpass filter connected in series with the output of the digital/analog converter. This lowpass filter is required there in any event in order to suppress the periodic continuations of the converted useful signal spectrum above half the sampling rate $W=f_A/2$.

The advantage of the method disclosed by Ritchie et al, supra, for the interpolative digital/analog conversion of PCM code words of a length of n bits lies in the reduction of the number of analog representative values required in the converter from $2^n$ to $2^k+1$. The requirements for linearity of the converter, however, remain unchanged and high. If, moreover, the switching frequency of the converter is considered, which is increased by the factor $N=2^m$, the method disclosed by Ritchie et al, supra, does not produce a noticeable advantage over the digital/analog conversion with weighted current sources, at least not for high amplitude resolution, for example, that corresponding to 16 bits per sample.

If the sampling rate required for PCM audio systems is placed between 32 and 50 kHz, a 16-bit converter will produce, in view of the clock pulse frequency ratio N, accumulator clock pulse frequencies in the GHz range. At the stated sampling rates, the above-described method for interpolative digital/analog conversion for high amplitude resolution is evidently unsuitable, and this has also been noted by Ritchie et al.

SUMMARY OF THE INVENTION

It is thus an object of the present invention to effect digital/analog conversion of PCM signals of the above-mentioned type using an inexpensive analog portion for the digital/analog converter so that the converter can be fabricated without precision components and without matching, thus making it possible to integrate the circuit.

The above and other objects are achieved, according to the invention by effecting a digital to analog conversion of PCM signals by a generalized interpolative procedure, by the steps of: sampling the PCM signals at a first sampling rate and effecting intermediate storage of each sampled PCM signal word in succession; supplying each stored word in succession to a first input of a first digital adder; dividing each word at the output of the adder into a first part representing the higher value portion of the adder output word and having a length shorter than that of the adder input word, and a second part representing the lower value part of the adder output word; conducting the second part of each adder output word through a digital, nonrecursive counter feedback filter having a degree greater than one at a clock pulse rate which is higher than, and an integral multiple of, the sampling rate, and supplying each resulting word at the filter output to a second input of the first digital adder where it is added to the stored word at the first adder input; transferring the first part of each adder output word at the clock pulse rate to a system output; setting the degree and pulse response of the filter to values minimizing the quantizing error, due to the difference in length and value between each adder output word first part and the corresponding sampled signal word, within the useful frequency band of the resulting signal in such a manner as to cause the power content of the quantizing error in that band to be negligible compared to the quantizing error power contained in the PCM signals; converting the successive adder output word first parts at the system output into an analog signal in a digital/analog converter having a small number of available output values; and passing the analog signal at the output of the converter through an analog lowpass filter for suppressing periodic continuations of the useful signal frequency band created by the sampling and for sufficiently attenuating the additional concentrated quantizing distortions due to the length of the adder output word first part being shorter than that of the word at the adder first input.

The method according to the invention leads to particularly inexpensive high resolution digital/analog converters since the required circuits can be produced without precision components and without the need for matching and are thus integratable.

In the digital/analog converter according to the invention, which employs only two representative values there will, in principle, occur no linearity errors.

BRIEF DESCRIPTION OF THE DRAWINGS

FIG. 3 is a diagram similar to that of FIG. 2 of a converter including a quantizer with feedback of the quantizing error as an equivalent structure for the interpolative digital/analog converter of FIG. 1a.

DESCRIPTION OF THE PREFERRED EMBODIMENTS

The operation of a digital/analog converter according to the invention is based on a generalized interpolative principle and relies on the fact that by cascading a plurality of interpolative networks, only one switched current source having two representative output amplitude values is required at the output of the converter. In cooperation with a series-connected lowpass filter, this one current source with two representative amplitude values is sufficient to represent a converted PCM signal as an analog signal. Thus it is possible, compared to the solution with weighted current sources and the method proposed by Ritchie et al, supra, to realize a high resolution digital/analog converter for 16-bit code word lengths and up to 50 kHz sampling frequency without the requirement for precision components and without matching. A further advantage of the solution according to the invention is that switching transient peaks can no longer occur.

The difference compared to the method employing weighted current sources described by Seitzer, supra, is that the analog portion of the converter according to the present invention includes only a single switched current source so that no high demands need be placed on the accuracy of its two representative amplitude values. Slight and gradual changes in these representative values appear merely as slight fluctuations in gain which can be tolerated, for example, in high quality PCM audio systems.

Figure 2:
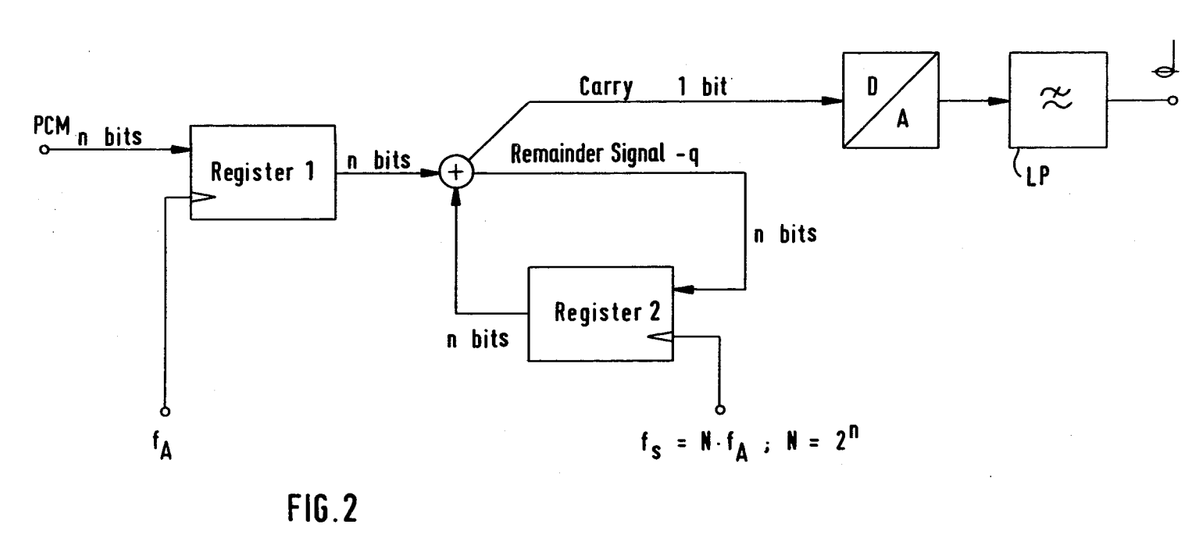
FIG. 2 is a block circuit of an interpolative digital-/analog converter based on the prior art and employing a 1-bit digital/analog converter.

The difference between the interpolative method described by Ritchie et al, supra, and the present invention is that the latter employs a plurality of cascaded interpolative networks. At least the first network at the input of the converter according to the invention includes a digital filter of a degree higher than the first. The effect of the interpolative digital/analog converter according to the invention will be explained below. Initially, a generalized interpolative principle will be derived from the special case of the interpolative structure according to Ritchie et al, supra, as shown in FIG. 2. This special case is characterized in that all n bits of each PCM code word present at the input are transferred in parallel via register 1 to the accumulator composed of register 2 and a binary adder. Only the highest value, or most significant, bit, in the (n+1)th bit position, of the sum signal produced in the adder is transferred to the output of the circuit, which can be interpreted as quantizing. The remainder of the sum signal, of a length of n bits, remaining in the accumulator loop then represents a quantizing error q which in the customary manner of interpretation must be treated with a negative sign.

Figure 3:
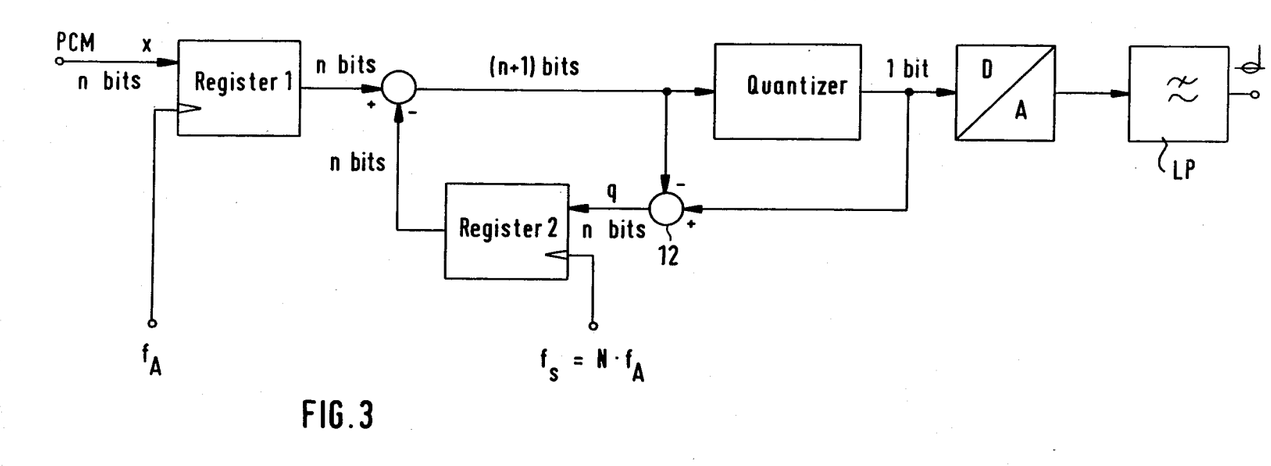

If the block circuit diagram of FIG. 2 is modified to correspond to this interpretation, the circuit of FIG. 3 results. In this circuit a quantizer is connected between register 1 and the D/A converter. The register 2 in the feedback path of the quantizing error signal q represents the simplest case of an error feedback filter of the first degree. The quantizer acts to convey to the D/A converter the bit in the most significant position of the (n+1) bits supplied to the quantizer. The entire (n+1) bit word is subtracted from the most significant bit in difference circuit 12 so that the output of the latter circuit will always have a negative or zero value.

Figure 4:
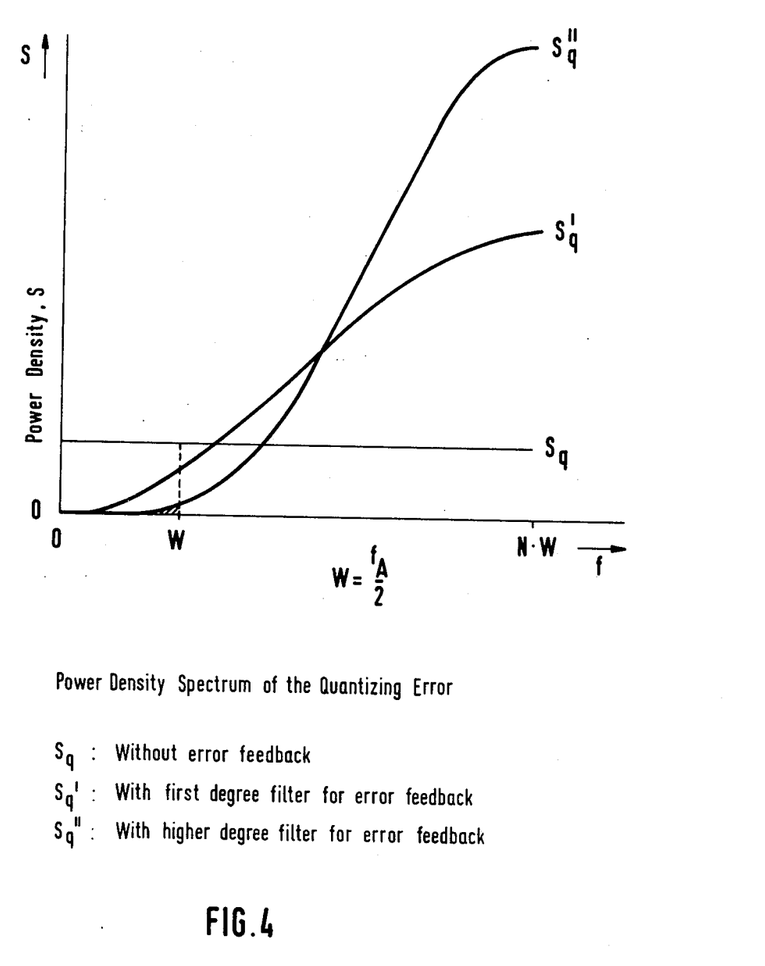
FIG. 4 is a performance diagram illustrating the influence of a filter for feeding back a quantizing error on the spectral distribution of the quantizing error.

The effect of this quantizing error feedback on the quantizing error power density spectrum at the output of the quantizer is qualitatively shown in FIG. 4. For purposes of simplification, it has here been assumed that the quantizing error power $S_q$ without error feedback has a constant power density spectrum.

The effect of the quantizing error feedback provided by the circuit of FIG. 3, employing a first degree filter, is that in the range of low frequencies the power of the quantizing error $S_q'$ is reduced while at the higher frequencies it increases. As is further indicated in FIG. 4, the use of higher degree error feedback filters can further lower the power of the quantizing error $S_q''$ in the frequency band $0 \leq f < W$ of the useful signal. On the other hand, the power density of the quantizing error increases more steeply above the signal band limit W. These components of the quantizing error power, however, can be sufficiently attenuated at the output of the digital/analog converter with the aid of a suitably designed analog lowpass filter.

Advisably transversal filters with the following complex transfer function:

$$G(z) = \sum_{r=1}^{R} g_r \cdot z^{-r}$$

are used for the error feedback, where R represents the degree of the filter and $g_r$ the filter coefficients.

z is the complex variable of the z-Transform.

The problem is to determine, for a given degree R, those coefficients $g_r$ which reduce the power of the quantizing error in the useful frequency band to a minimum.

In order to be able to solve this optimizing problem, it is assumed, for the sake of simplification, that the quantizing error is not correlated with the PCM signal at the input of the converter. Then, under the assumption made above that without error feedback its spectrum is white, the following applies for the power density spectrum of the quantizing error:

$$S_q'' = |1 - G(f)|^2 \cdot S_q$$

where $G(f) = \sum_{r=1}^{R} g_r \cdot e^{-j2\pi r f \tau}; \tau = \frac{1}{2NW}$ The condition for minimum power, $P_q^*$, in the quantizing error in the signal frequency band $0 \leq f < W$ is now:

$$P_q^* = 2 \cdot S_q \cdot \int_0^W |1 - G(f)|^2 df \stackrel{!}{=} \text{Min}$$

This means that the left hand term of " Min" shall be minimized.

This integral can be solved in a closed manner for feedback filter transfer function G(z) for any desired degree R. A linear equation system for determining the optimum filter coefficients $g_r$ is obtained if the solved integral is partially differentiated for all coefficients $g_r$ and the differentials are set to equal zero. For the case where $N \gg 1$, a good approximation of the optimum filter coefficients are the binomial coefficients with alternating sign, as they are compiled for various filter degrees in the table of FIG. 5.

The analog lowpass filter LP at the output of the digital/analog converter serves to suppress the periodic continuations of the signal frequency band as they occurred during sampling. In interpolative converters it simultaneously attenuates the spectral components of high quantizing noise power in the blocking frequency band $f \leq W$. With a sufficiently high blocking attenuation, these components are negligible compared to the quantizing error power $P_q^*$ in the signal frequency band $0 \leq f < W$ so that $P_q^*$ represents, to a good approximation, the error power in the output signal of the entire PCM decoder as produced in the interpolative digital/analog converter by quantizing distortions.

In contradistinction thereto, the quantizing error power of the quantizer operated at the clock pulse frequency $N \cdot f_A = 2 \cdot N \cdot W$ without quantizing error feedback is calculated, under the already made assumption of a constant power density $S_q$ for this error, as $$P_q = 2 \cdot NW \cdot S_q$$

The power ratio $P_q/P_q^*$ is called the gain of the interpolative conversion process. This gain is a measure for the amplitude resolution of the interpolative digital/analog converter.

For a required resolution of the interpolative digital/analog converter corresponding to n bits per sample, the gain $P_q/P_q^*$ must be greater than the maximum ratio between signal power and quantizing error power of an equivalent quantizer having $2^n$ stages. With this prequisite, the output signal of the interpolative PCM decoder contains essentially only the error power produced by quantizing the analog/digital conversion.

Figure 5:
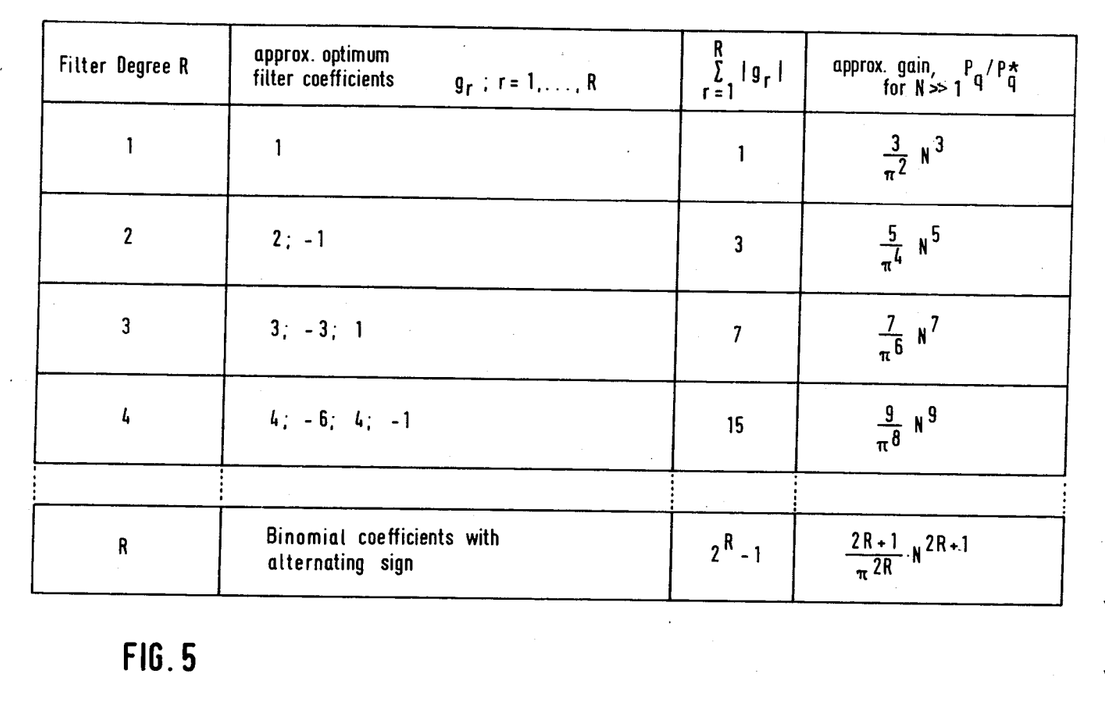
FIG. 5 is a chart illustrating parameters of the generalized structure of the interpolative method for digital-/analog conversion for various degree of filter for feeding back the quantizing error.

The gain of the interpolative digital/analog conversion depends on the ratio N of the clock pulse frequency of the error feedback loop to the PCM sampling frequency. In the table of FIG. 5, the gain $P_q/P_q^*$ is stated to a good approximation for various degrees of the optimized error feedback filter and for $N \gg 1$. These results are obtained if the transfer functions G(f) of the optimized error feedback filter are inserted in each one of the above relationships in place of $P_q^*$.

For example, for the design of an interpolative 16-bit digital/analog converter a minimum gain of about 105 dB is necessary since the maximum signal-to-quantizing noise ratio for sinusoidal signals at the output of an equivalent quantizer having $2^{16}$ stages is about 98 dB, as disclosed in Seitzer, supra. With a given sampling rate of $f_A = 50$ kHz, the required clock pulse frequency $N \cdot f_A$ for the error feedback loop is calculated from the minimum gain through the given relationships in the table of FIG. 5 in dependence on the degree R of the optimized error feedback filter. A clock pulse frequency of $32 \cdot f_A$, which is particularly favorable for the realization of the converter circuit, results for the case where $R = 4$.

Figure 6:
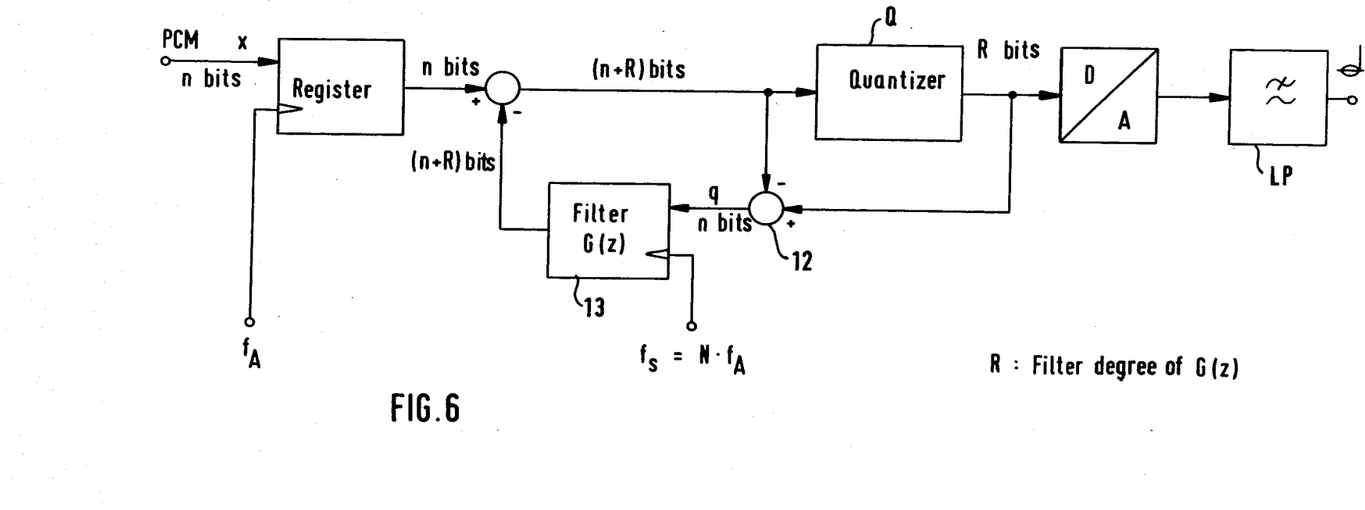
FIG. 6 is a clock circuit diagram of an improved structure for the interpolative digital/analog converter according to the invention for reducing the required loop clock pulse frequency $f_s$ with a given resolution of n bits per sample.

The generalized structure of an interpolative digital/analog converter with optimized error feedback filter G(z) is shown in FIG. 6. As can be seen from the sums of the optimized filter coefficients tabulated in FIG. 5, the code word length of the signal at the output of the error feedback filter increases with increasing filter degree R compared to the code word length of the quantizing error q at the filter input. Under consideration of the PCM signal at the input of the converter, the required number of $2^R$ quantizing stages, or levels, results for the quantizer, insofar as the filter degree is R>1.

Because of this particularity of the generalized structure of the interpolative digital/analog converter, a plurality of interpolation networks would have to be cascaded in order to reduce the number of quantizing levels required successively down to two thus requiring only one switched current source at the output of the entire converter. The first stage of this multistage interpolative converter then must always employ the error feedback filter with the highest required degree and the last stage a filter with the degree R=1. The above requirements for minimum gain apply for every stage.

Figure 7:
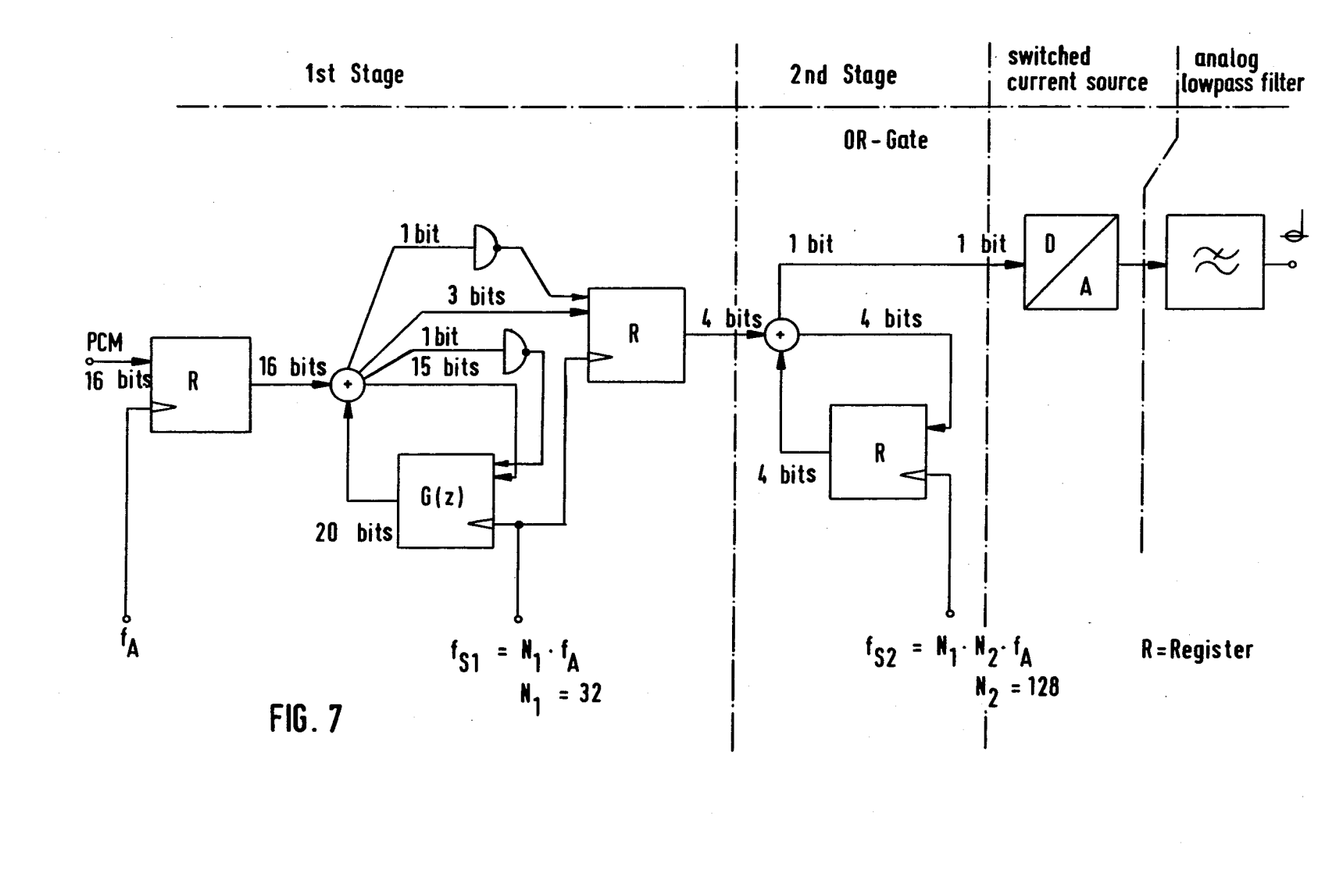
FIG. 7 is a block circuit diagram of a two-stage interpolative digital/analog converter according to the invention.

The example of a two-stage interpolative 16-bit digital/analog converter is shown in FIG. 7. The structure of the filter G(z) shown there in simplified form is shown in detail in FIG. 8. Reference is made in this connection to the fact that in order to separate the negative quantizing error from the output signal of the quantizer it is merely necessary to branch out the signal lines as shown in FIG. 2.

With a sampling rate of $f_A$=50 kHz the interpolative 16-bit digital/analog converter of FIG. 7 will have the following clock pulse frequencies:

1st stage: $f_{S1}$=1.6 MHz;
2nd stage: $f_{S2}$=204.8 MHz.

The relatively low clock pulse frequency $f_{S1}$ in the first stage permits, even with a view toward integration of the circuit, serial processing of the bits of the input signal words and the quantizing error words. Due to the simple filter coefficients, this results in a particularly economical realization of the error feedback filter according to the principle of distributed arithmetic as described in Kammeyer, K. D., "Analyse des Quantisierungsfehlers bei der Verteilten Arithmetik" [Analysis of the Quantizing Error in Distributed Arithmetic], published by the University at Erlangen, Nüôùëüôé Äüöüôäï Ôüëëïï áá Éüôôäù 1977. In this form of construction the multipliers for the coefficients can be omitted.

Due to its simple structure, the second stage of the 16-bit digital/analog converter according to FIG. 7 can alternatively be fabricated economically by the use of a small fixed value memory. This stage produces at its output one of a total of 16 different serial bit patterns, each 16 bits long, in dependence on the output signal from the first stage present at the input. Controlled by this signal, the respective actual one of 16 permanently stored bit patterns is addressed, transferred in parallel into a shift register at the clock pulse frequency $f_{S21}$ and serially read out of the shift register at the clock pulse frequency $f_{S22}$.

Figure 9:
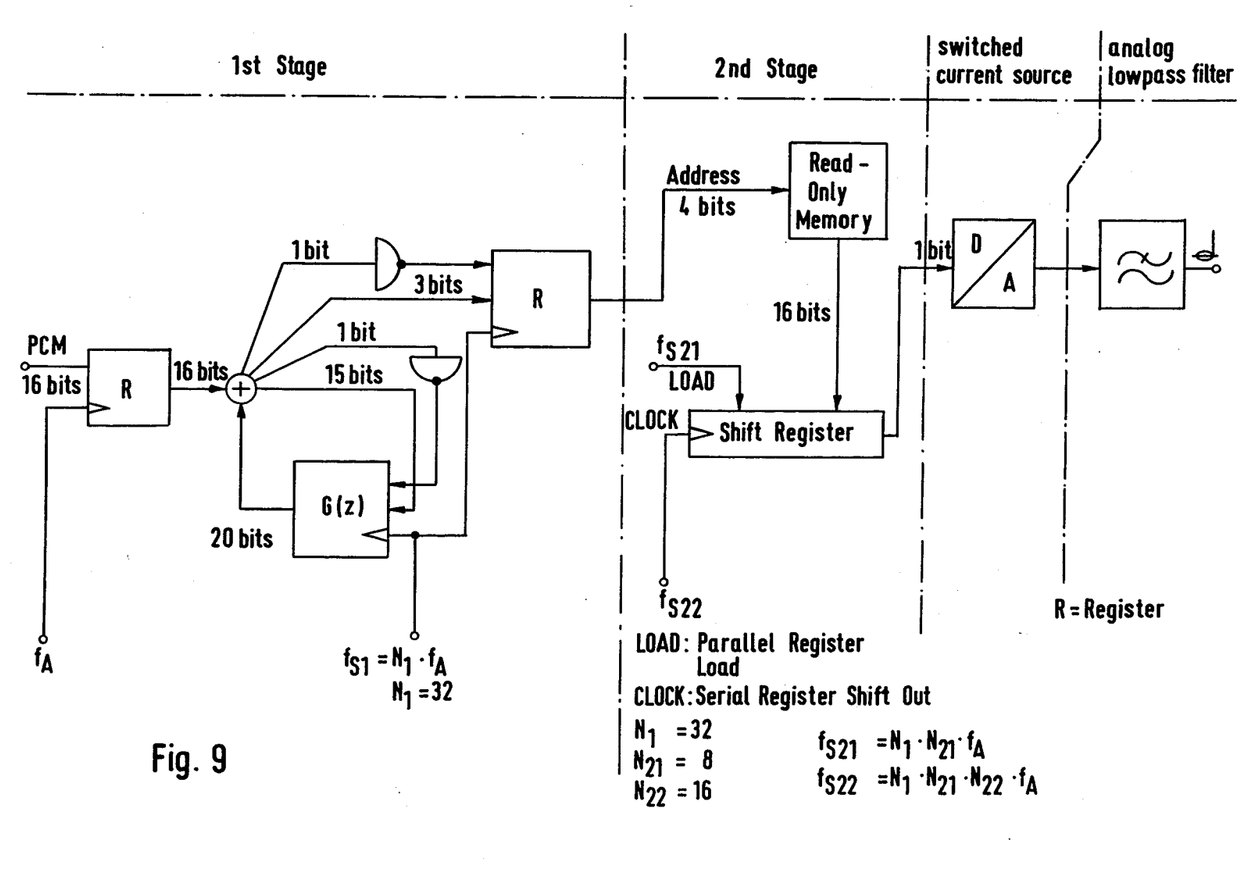
FIG. 9 is a block circuit diagram of a two-stage interpolative digital/analog converter according to the invention with a read-only memory in the second stage containing a set of 16 different 16-bit-patterns.

The above described circuitry of the second stage is shown in FIG. 9.

Figure 8:
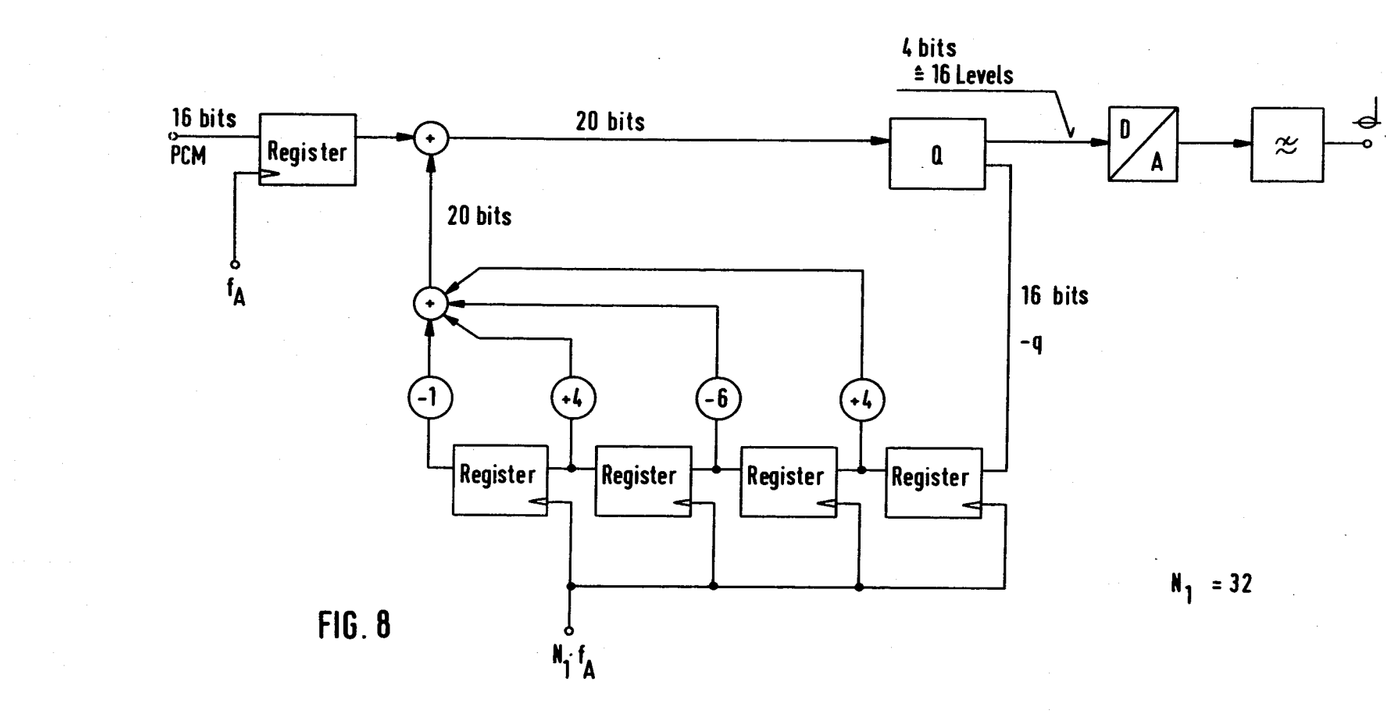
FIG. 8 is a block circuit diagram of an interpolative digital/analog converter according to the invention with a fourth degree filter for feeding back the quantizing error.

The quantizer Q in FIGS. 6 and 8 is a uniform midraiser quantizer with $2^R$ levels. In case that the codewords are represented in the two's complement binary code the mid-raiser quantizer can be realized by dividing the input code word into R higher order bits, which are transferred to the digital/analog converter, and into n lower order bits of which the most significant bit is inverted. The resulting remainder code word represents the quantizing error −q.

In FIG. 8 the circles represent digital multiplications. At the output of each register the delayed quantizing error −q is multiplied by the coefficient corresponding to the number in the circle.

The phrase "periodic continuations of the useful signal frequency band" could be substituted by the following phrase "the frequency components outside the signal frequency band $W=f_A/2$".

With the exception of FIG. 9 the bits of each code word are assumed to be processed in parallel.

The term "PCM" stands for Pulse-Code Modulation.

The cutoff frequency $W=f_A/2$ depends upon the application of the digital/analog converter and could be about 20 kHz for sound signals.

It will be understood that the above description of the present invention is susceptible to various modifications, changes and adaptations, and the same are intended to be comprehended within the meaning and range of equivalents of the appended claims.

What is claimed is:

1. A method for effecting digital to analog conversion of PCM signals by a generalized interpolative procedure, comprising the steps of: sampling the PCM signals at a first sampling rate and effecting intermediate storage of each sampled PCM signal word in succession; supplying each stored word in succession to a first input of a first digital adder; dividing each word at the output of the adder into a first part representing the higher value portion of the adder output word and having a length shorter than that of the adder input word, and a second part representing the lower value part of the adder output word; conducting the second part of each adder output word through a digital, nonrecursive counter feedback filter having a degree greater than one at a clock pulse rate which is an integral multiple of the sampling rate, and supplying each resulting word at the filter output to a second input of the first digital adder where it is added to the stored word at the first adder input; transferring the first part of each adder output word at the clock pulse rate to a system output; setting the degree and pulse response of the filter to values minimizing the quantizing error, due to the difference in length and value between each adder output word first part and the corresponding sampled signal word, within the useful frequency band of the resulting signal in such a manner as to cause the power content of the quantizing error in that band to be negligible compared to the quantizing error power contained in the PCM signals; converting the successive adder output word first parts at the system output into an analog signal to a digital/analog converter having a small number of available output values; and passing the analog signal at the output of the converter through an analog lowpass filter for suppressing periodic continuations of the useful signal frequency band created by the sampling and for sufficiently attenuating the additional concentrated quantizing distortions due to the length of the adder output word first part being shorter than that of the word at the adder first input, wherein said step of conducting comprises: storing in respective locations of a fixed value memory representations of the filter coefficients; feeding the second part of each adder output word through a shift register chain having taps which are connected to the address input of the fixed value memory, the taps being so arranged that at each of them there appears one identical-value bit of the output word second parts; reading the representations out of one of the memory locations together with the bit pattern present at the shift register chain taps; summing the read out representations in an accumulative circuit connected between the output of the memory and the second digital adder input in such a manner that after a number of clock pulses corresponding to the length of each adder output word second part, a new word appears at the accumulator circuit output.

2. A method for effecting digital to analog conversion of PCM signals by a generalized interpolative procedure, comprising the steps of: sampling the PCM signals at a first sampling rate and effecting intermediate storage of each sampled PCM signal word in succession; supplying each stored word in succession to a first input of a first digital adder; dividing each word at the output of the adder into a first part representing the higher value portion of the adder output word and having a length shorter than that of the adder input word, and a second part representing the lower value part of the adder output word; conducting the second part of each adder output word through a digital, nonrecursive counter feedback filter having a degree greater than one at a clock pulse rate which is an integral multiple of the sampling rate, and supplying each resulting word at the filter output to a second input of the first digital adder where it is added to the stored word at the first adder input; transferring the first part of each adder output word at the clock pulse rate to a system output; setting the degree and pulse response of the filter to values minimizing the quantizing error, due to the difference in length and value between each adder output word first part and the corresponding sampled signal word, within the useful frequency band of the resulting signal in such a manner as to cause the power content of the quantizing error in that band to be negligible compared to the quantizing error power contained in the PCM signals; converting the successive adder output word first parts at the system output into an analog signal in a digital-/analog converter having a small number of available output values; and passing the analog signal at the output of the converter through an analog lowpass filter for suppressing periodic continuations of the useful signal frequency band created by the sampling and for sufficiently attenuating the additional concentrated quantizing distortions due to the length of the adder output word first part being shorter than that of the word at the adder first input, wherein said step of converting comprises subjecting each adder output first part to at least one further reduction of length in at least one further interpolative network, the last of which networks includes a second digital adder having one input connected to receive the higher value part of each word produced by the preceding network, and a digital accumulator connected in feedback between the output of the second adder and a second input of the second adder, said step of subjecting including passing the lower value part of each word at the output of the second adder through the accumulator at a second clock pulse rate higher than the first-recited clock pulse rate and conducting only the highest order bit of each word at the output of the second adder to the digital-/analog converter, and wherein the digital/analog converter has only two available output values.

3. A method for effecting digital to analog conversion of PCM signals by a generalized interpolative procedure, comprising the steps of: sampling the PCM signals at a first sampling rate and effecting intermediate storage of each sampled PCM signal word in succession; supplying each stored word in succession to a first input of a first digital adder; dividing each word at the output of the adder into a first part representing the higher value portion of the adder output word and having a length shorter than that of the adder input word, and a second part representing the lower value part of the adder output word; conducting the second part of each adder output word through a digital, nonrecursive counter feedback filter having a degree greater than one at a clock pulse rate which is an integral multiple of the sampling rate, and supplying each resulting word at the filter output to a second input of the first digital adder where it is added to the stored word at the first adder input; transferring the first part of each adder output word at the clock pulse rate to a system output; setting the degree and pulse response of the filter to values minimizing the quantizing error, due to the difference in length and value between each adder output word first part and the corresponding sampled signal word, within the useful frequency band of the resulting signal in such a manner as to cause the power content of the quantizing error in that band to be negligible compared to the quantizing error power contained in the PCM signals; converting the successive adder output word first parts at the system output into an analog signal in a digital-/analog converter having a small number of available output values; and passing the analog signal at the output of the converter through an analog lowpass filter for suppressing periodic continuations of the useful signal frequency band created by the sampling and for sufficiently attenuating the additional concentrated quantizing distortions due to the length of the adder output word first part being shorter than that of the word at the adder first input, wherein said step of converting comprises subjecting each adder output first part to at least one further reduction of length in at least one further interpolative network, the last of which networks includes a read-only memory containing, in respective locations, all possible bit serial patterns corresponding to all possible values of the higher value part of each word produced by the preceding network, and said step of subjecting includes addressing the memory with the higher value part of each work produced by the preceding network, transferring the bit serial pattern at the addressed location into a register and reading that pattern out of the register serially to the digital-/analog converter, and wherein the digital/analog converter has only two available output values.

4. A method as defined in claim 2 or 3, wherein said step of conducting comprises: storing in respective locations of a fixed value memory representations of the filter coefficients; feeding the second part of each adder output word through a shift register chain having taps which are connected to the address input of the fixed value memory, the taps being so arranged that at each of them there appears one identical-value bit of the output word second parts; reading the representations out of one of the memory locations together with the bit pattern present at the shift register chain taps; summing the read out representations in an accumulative circuit connected between the output of the memory and the second digital adder input in such a manner that after a number of clock pulses corresponding to the length of each adder output word second part, a new word appears at the accumulator circuit output.

* * * * *